(12) United States Patent
Chi et al.

(10) Patent No.: US 8,208,286 B2
(45) Date of Patent: Jun. 26, 2012

(54) GREEN TRANSISTOR FOR RESISTIVE RANDOM ACCESS MEMORY AND METHOD OF OPERATING THE SAME

(75) Inventors: Min-Hwa Chi, Shanghai (CN); Deyuan Xiao, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 122 days.

(21) Appl. No.: 12/861,622

(22) Filed: Aug. 23, 2010

(65) Prior Publication Data

US 2011/0063888 A1 Mar. 17, 2011

(30) Foreign Application Priority Data

Sep. 11, 2009 (CN) .............................. 200910195630

(51) Int. Cl.
*G11C 11/00* (2006.01)
*G11C 11/36* (2006.01)
*H01L 21/02* (2006.01)
(52) U.S. Cl. ......... 365/148; 365/163; 365/175; 257/498
(58) Field of Classification Search .................. 365/148, 365/163, 175; 257/408
See application file for complete search history.

(56) References Cited

U.S. PATENT DOCUMENTS

| | | | | |
|---|---|---|---|---|
| 7,016,222 B2 * | 3/2006 | Morikawa | ...................... | 365/148 |
| 7,535,746 B2 * | 5/2009 | Kawazoe et al. | ............. | 365/148 |
| 7,577,024 B2 * | 8/2009 | Fackenthal et al. | ........... | 365/148 |
| 7,894,250 B2 * | 2/2011 | Wang et al. | .................... | 365/148 |
| 7,940,553 B2 * | 5/2011 | Wu et al. | ........................ | 365/148 |
| 8,009,455 B2 * | 8/2011 | Lowrey et al. | ................. | 365/148 |
| 8,102,698 B2 * | 1/2012 | Scheuerlein | .................... | 365/148 |
| 8,116,159 B2 * | 2/2012 | Lowrey et al. | ................. | 365/148 |

OTHER PUBLICATIONS

Chenming Hu, et al., "Green Transistor—A $V_{DD}$ Scaling Path for Future Low Power ICs", 2 pages, 2008 IEEE.

* cited by examiner

*Primary Examiner* — Trong Phan
(74) *Attorney, Agent, or Firm* — Squire Sanders (US) LLP

(57) ABSTRACT

A random access memory includes a plurality of memory cells arrayed in bit-lines and word-lines. Each memory cell comprises a green transistor (gFET) including a gate, a source, and a drain; a switching resistor including a first terminal and a second terminal; and a reference resistor including a third terminal and a fourth terminal. The first terminal of the switching resistor and the third terminal is connected to a bit-line, the second terminal of the switching resistor is connected to the first source of the gFET, the fourth terminal of the reference resistor is connected to the second source of the gFET, and the gate of the gFET is connected to a word-line. The method of operating the RRAM includes a write operation and a read operation The write operation comprises steps of: applying a first voltage to the bit-line to perform a large voltage difference across the bit-line and the drain of the gFET, applying a second voltage to the gate of the gFET to turn on the gFET transiently, and a large current pulse flowing through the switching resistor for changing the resistance state. The read operation comprises steps of: applying a third voltage to the bit-line to perform a small voltage difference across the bit-line and the drain of the gFET, applying a second voltage to the word-line to turn on the gFET, and comparing the current through the switching resistor with the current through the reference resistor so as to read the data stored in the memory cell.

22 Claims, 17 Drawing Sheets

| S110 |
|---|
| applying a first voltage pulse with pulse height $V_H$ (+Vcc/2) to the bit line 300. The drain is grounded. |

| S111 |
|---|
| applying a second voltage pulse with height $V_g$ (-Vcc/2) to the gate of the gFET 200 through the word line 400. |

S120
applying a third voltage pulse with pulse height $V_L$ (~0.1v to 1v) to the bit line 300 to produce a small voltage across the drain and source of the gFET 200 than in write operation.

S121
applying a second voltage pulse with pulse height (~Vcc/2) to the word line 400 to turn on the gFET 200 so that the read current is measured for reading the data stored in the memory cell.

S210
applying a first positive voltage pulse with pulse height $V_{fl}$ (+Vcc/2) to the bit line 1300. The drain is grounded.

S211
applying a second negative voltage pulse with pulse height $V_g$ (−Vcc/2) to the gate of the gFET 1200 through the word line 1400 so that a large enough negative voltage at the gate with respect to the source is established to turn on the green transistor 1200.

```
                                              ┌─ S310
  applying a first voltage pulse with pulse height V_H (+Vcc/2) to the
  first bit line 2301 or the second bit line 2302. The drain is grounded.

┌─ S311
  applying a second voltage pulse with pulse height V_g (-Vcc/2) to the
  gate of the gFET 2200 through the word line 2400 to turn on the
  gFET 2200 transiently.
```

S320
applying a third voltage pulse with pulse height $V_L$ (~0.1v to 1v) to the first bit line 2301 or second bit line 2302. The drain is grounded.

S321
applying a second voltage pulse with pulse height (-Vcc/2) to the word line 2400 to turn on the gFET 2200 in order to produce the read currents through the first and the second switching resistors for reading the data stored in the memory cell.

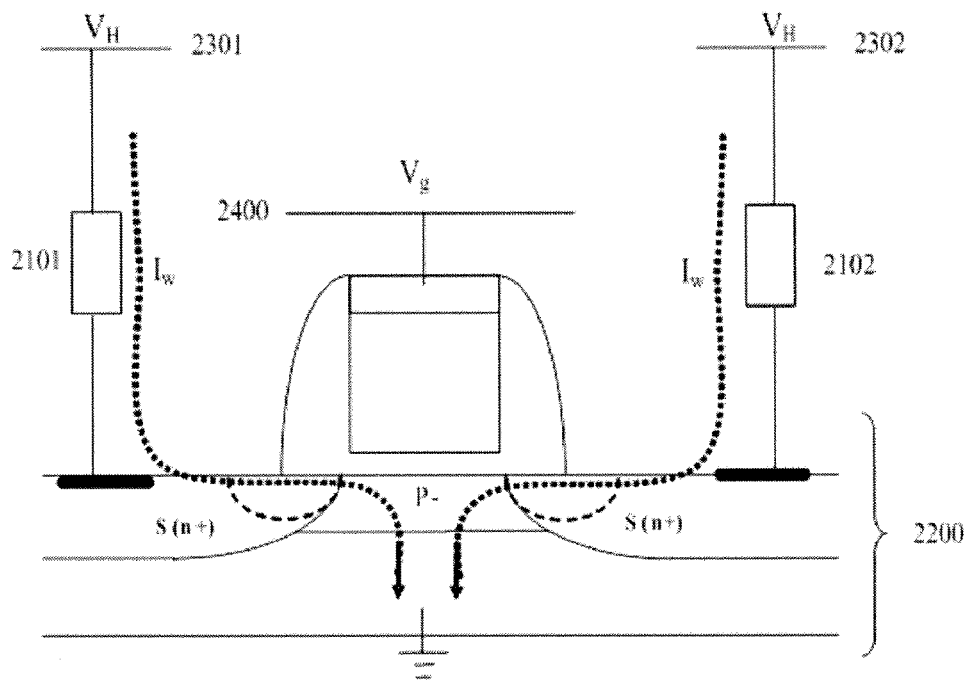

FIG.17a

S410
Applying a first voltage pulse to the first bit line 2301, and applying a second voltage pulse to the word line 2400 to turn on the gFET 2200. The high write current pulse triggers the change of the resistance state and stores data into the first switching resistor. Repeat the above procedure and store the opposite resistance state (than the first switching resistor) into the second switching resistor.

S411
Applying a first voltage pulse with pulse height $V_H$ (+Vcc/2) to the first bit line 2301. The second bit line 2302 is grounded. The drain is grounded

S412
Applying a second voltage pulse with pulse height $V_g$ (-Vcc/2) to the gate of the gFET 2200 through the word line 2400 to turn on the gFET 2200. The writing current pulse triggers resistance change in the first switching resistors. The pulse duration at gate pulse determines the data written in the resistance is "1" or "0".

FIG.17b

S420
applying a third voltage pulse with pulse height $V_L$ (0.1v to 1v) to the first bit line 2301 and the second bit line 2302. The drain is grounded.

S421
applying a second voltage pulse with pulse height (-Vcc/2) to the word line 2400 to turn on the gFET 2200 to trigger the read currents in the first and the second switching resistors.

GREEN TRANSISTOR FOR RESISTIVE RANDOM ACCESS MEMORY AND METHOD OF OPERATING THE SAME

CROSS REFERENCE TO RELATED APPLICATIONS

The present application claims the priority of Chinese Patent Application No. 200910195630.8, entitled "Green transistor, resistive random access memories and methods of operating the same", and filed Sep. 11, 2009, the entire disclosure of which is incorporated herein by reference.

BACKGROUND OF THE INVENTION

1. Field of the Invention

The present invention relates to the integrated circuit memory, and particularly relates to a green MOSFET transistor serving as the select transistor for a resistive random access memories and methods of operating the same.

2. Description of Prior Art

Recently, a new type of memory, the resistive random access memory (RRAM) has attracted much attention due to its high memory density, low-cost, lower power consumption and high endurance. The bi-stable resistance states of the RRAM memory cell can be changed electrically when applied to a large voltage or current pulse; and the RRAM memory cell can maintain the resistance state for a long period of time after the voltage or current pulse.

An RRAM includes an array of memory cells organized in rows and columns. FIG. 1 is a schematic diagram of a conventional RRAM array. As shown in FIG. 1, a memory cell 100, which includes a switching resistor 101 and a select transistor 102, is referred to as "1T1R" cell. The select transistor 102 is typically a MOSFET transistor for accessing the switching resistor 101 to perform the read/write operations. We assume the select transistor is n-type MOSFET for convenience in this text. The switching resistor 101 has two terminals, one is connected to a bit-line 103, and the other is connected to the drain of the select transistor 102. The gate of the select transistor 102 is connected to a word-line 104, and the source of the select transistor 102 is grounded. The bistable resistance states of the switching resistor 101 represent the digital data '0' and '1'. The resistance states are switchable by applying a large enough voltage or current pulse through the switching resistor 101. For convenience, a high resistance state is arbitrarily defined as data '1', a low resistance state as data '0'.

FIG. 2 illustrates the waveforms for a conventional method of operating the RRAM in FIG. 1. The pulse height and duration shown in FIG. 2 are only for illustration purposes (and similarly for FIGS. 7, 12, 16, and 19), and the preferred range of pulse height and duration will be mentioned in following embodiments accordingly. The method includes a write operation and a read operation.

During the write operation, a voltage pulse $V_H$ (typically height ~Vcc) is applied to the bit-line 103, where Vcc is the voltage source from external power supply, typically available with 3.3 v, 2.5 v, or 1.8 v depending on the system specifications. The voltage pulse is applied on the gate through the word-line 104 to turn on the select transistor 102. A large enough current pulse through the switching resistor 101 is resulted. Depending on the magnitude and duration of the current pulse for enough heat dissipation in the resistor, the resistance state can be changed from high to low resistance state (referred to as SET operation) as "0", or reversely, from low to high resistance state (referred to as RESET operation) as "1".

During the read operation, a voltage pulse with pulse height $V_L$ (typically 0.1 v to 1 v) is applied to the bit-line 103. Then the select transistor 102 is turned on by applying a voltage pulse on the gate through the word-line 104. The voltage pulse height and duration is selected properly so that the current flowing through the resistor is small enough to avoid read disturb (by the small heat dissipation) and also large enough for sense amplifier to determine the resistance. The sense amplifier compares the current through the switching resistor 101 with respect to a reference current from periphery circuit (not shown in FIG. 1). For convenience, data "0" is represented by a larger current with respect to the reference current (corresponding to low resistance state), and data "1" by a smaller read current (corresponding to high resistance state).

The leakage current of the select transistor is undesirable as it degrades the retention of the switching resistors 101 (due to the continuous dissipation of a small amount of heat in the resistor by the leakage current). It is also difficult to scale down the operating voltage and the size of the MOSFET select transistor due to a need of large current pulse during write.

One solution to this problem is to adopt the new green MOSFET transistor (gFET) as the select transistor, which has been proposed by C. Hu et. al. in the paper titled 'Green Transistor-A VDD Scaling Path for Future Low Power ICs'. The gFET can enhance the GIDL current based on band-to-band tunneling (BTBT) by implanting an opposite type of dopant into the source or drain. The BTBT is a mechanism that carriers tunnel through the energy barrier across the valence band and conduction band.

FIG. 3a is a schematic diagram of a conventional gFET. The conventional gFET comprises: a silicon on insulator (SOI) 310 and a gate stack (not labeled). The silicon on insulator (SOI) 310 includes a substrate 311, a buried oxide 312 and a top silicon 313. The gate stack is formed on the top silicon 313 and includes a gate oxide 316 and a gate 317. A drain 315 and a source 314 with different conductivities are formed respectively on two sides of the gate oxide 316 and in the top silicon 313. A lightly-doped region 319 and a pocket implant region 318 are formed in the top silicon 313 and neighboring to each other. The lightly-doped region 319 and the pocket implant region 318 are respectively aligned with the gate 317 and gate oxide 316. Both of the pocket implant region 318 and the lightly-doped region 319 have the same conductivity as the drain 315. The source 314, the drain 315 and the lightly-doped region 319 are all in contact with the buried oxide 312. The pocket implant region 318 is of less depth and is not directly in contact with the buried oxide 312.

For convenience, the type of the gFET is defined by the type of the pocket implant region 318. For example, a p-type gFET includes a p-type pocket implant region 318, an n-type source 314, and a p-type drain 315. An n-type gFET includes an n-type pocket implant region 318, a p-type source 314, and an n-type drain 315.

As an example, a p-type gFET is described in details below.

FIG. 3b is a band diagram of the band-bending near the pocket implant region 318, wherein valence band electrons may tunnel into the conduction band of the source 314 if the band is bent large enough, e.g. the solid curve 301, 301a denotes the band-bending when the gFET is turned on with the gate 317 negatively biased with respect to the source 314 and the potential of the implant region 318 lowered. Therefore, the upper edge of the valence band (Ev) of the implant region 318 is higher than the lower edge of the conduction band (Ec). Under this condition, the electrons in the valence band can start tunneling into the conduction band, leaving holes in the valence band correspondingly. The dotted curves 302, 302a represent the band-bending when the gFET is turned off with no bias across the gate 317 and the source 314. The upper edge of the valence band (Ev) of the implant region 318 is lower than the lower edge of the conduction band (Ec), which leads to a large barrier between the conduction band and the valence band and no carriers can tunnel through.

FIG. 3c illustrates the currents when a p-type gFET is turned on. Referring to FIG. 3a, the p-type gFET includes a $P^+$-type pocket implant region 318, an $N^+$-type source 314, a $P^+$-type lightly-doped region 319 and a $P^+$-type drain 315. Referring to FIGS. 3b and 3c, when the (n-type) source 314 is biased to a voltage (Vs) higher than a voltage (Vd) applied to the (p-type) drain 315 (Vsd>0), and the gate 317 is biased to a voltage (Vg) more negative enough with respect to the source 314 (for enough band-bending), the valence band electrons in the p-type pocket implant region 318 will tunnel into the n-type source 314 by the BTBT mechanism. The holes in the p-type pocket implant region 318 will move toward the p-type drain 315 through the lightly-doped region 319 by drift mechanism due to electrical field. As a result, a current is flowing from the source 314 to the drain 315, and the p-type gFET is turned on.

The gFET has many advantages over the conventional MOSFET, such as smaller sub-threshold swing, lower threshold voltage, low voltage operation, less power consumption and higher driving current. Thus, the gFET is a great replacement of the conventional MOSFET as select transistor in the memory cell mainly for its low voltage operation.

SUMMARY OF THE INVENTION

An object is to provide a gFET which has two symmetrical sources in structure.

Another object is to provide a resistive random access memory utilizing a gFET as the select transistor.

A further object is to provide a method of operating the RRAM which is presented in the invention.

From the first aspect of the present invention, the gFET comprises: a substrate; a gate formed on the substrate, and separated from the substrate by a gate dielectric; a drain formed under the gate and in the substrate; a first source formed near one side of the gate and in the drain; a first pocket implant region formed in the first source; a second source and a second pocket implant region symmetrically formed under the other side of the gate in the drain, and spaced apart from the first source and the first pocket implant region. Both of the first and the second pocket implant region have the same conductivity as the drain, and have the opposite conductivity to the first and the second sources.

From the second aspect of the present invention, the RRAM includes a plurality of memory cells arranged in array with bit-lines and word-lines. Each memory cell comprises a gFET including a gate, a source, and a drain; a switching resistor including a first terminal and a second terminal; and a reference resistor including a third terminal and a fourth terminal. The first terminal of the switching resistor and the third terminal are connected to a bit-line. The second terminal of the switching resistor is connected to the first source of the green transistor. The fourth terminal of the reference resistor is connected to the second source of the gFET. The gate of the gFET is connected to a word-line.

From the third aspect of the present invention, the method of operating the RRAM includes a write operation and a read operation: during the write operation, the method comprising steps of: applying a first voltage to the bit-line to perform a large voltage difference across the bit-line and the drain of the green transistor, applying a second voltage pulse to the gate of the gFET to turn on the gFET, a large current pulse being flowing through the switching resistor so that the resistance state of the switching resistor is changed; during the write operation, the method comprising steps of: applying a third voltage to the bit-line to perform a small voltage difference across the bit-line and the drain of the green transistor, applying a second voltage to the word-line to turn on the gFET, comparing the current flowing through the switching resistor with the current through the reference resistor so as to read the data stored in the memory cell.

Many benefits are achieved by way of the present invention over conventional techniques. For example, the power consumption of select transistors can be greatly reduced with the gFET serving as the select transistor. The RRAM array presented in this invention has superior scalability for resistors and leads to a memory array with higher density.

BRIEF DESCRIPTION OF THE DRAWINGS

FIG. 3c illustrates the currents when the p-type gFET is turned on.

FIG. 17a illustrates the write operation of the third embodiment of the RRAM array.

FIG. 17b is a flow chart of the write operation of the fourth method according to the present invention.

DETAILED DESCRIPTION OF THE EMBODIMENTS

The present invention provides a gFET used as select transistor for the resistive random access memories (RRAM) and the methods of operating the same.

Figure 1:
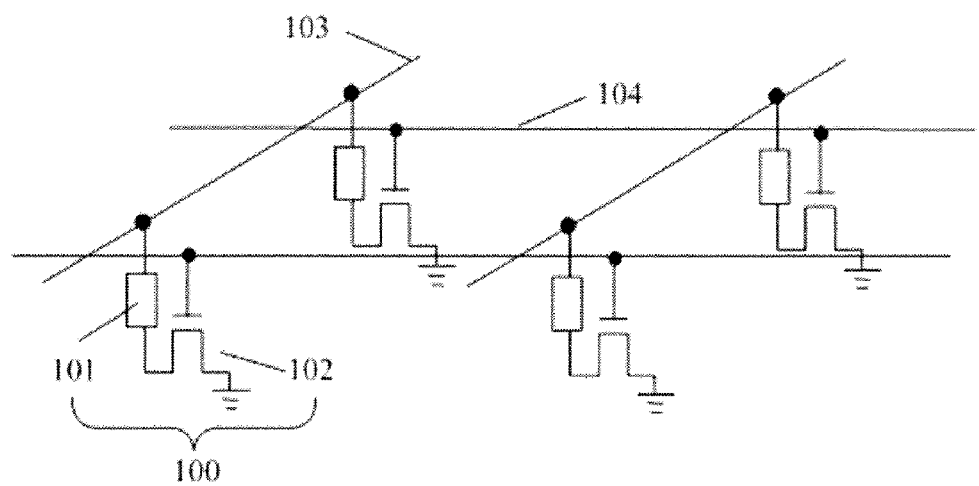
FIG. 1 is a schematic diagram of a conventional RRAM array.
Figure 2:
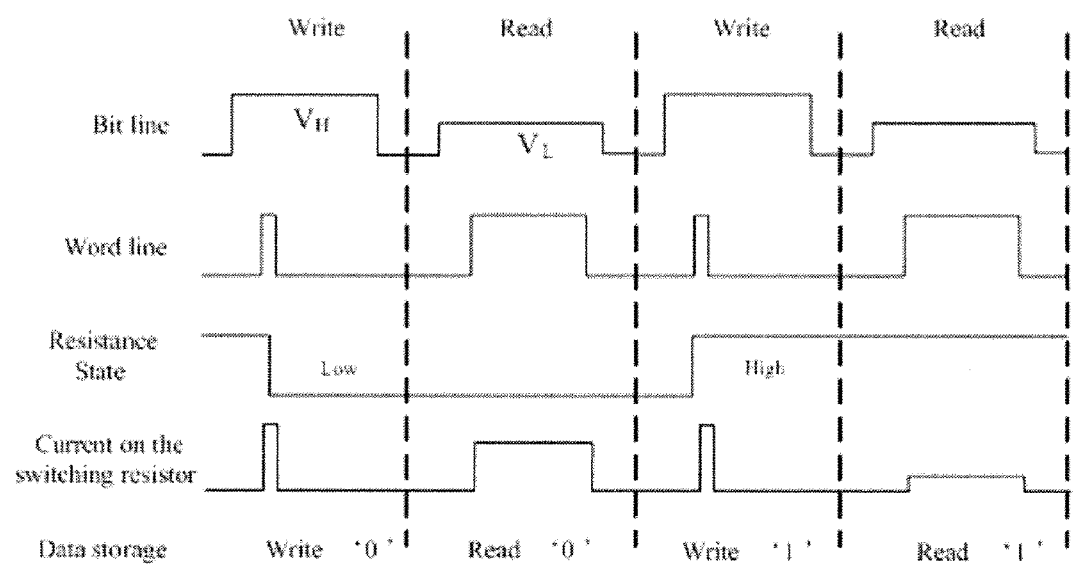
FIG. 2 illustrates a conventional method of operating the RRAM in FIG. 1.
Figure 3A:
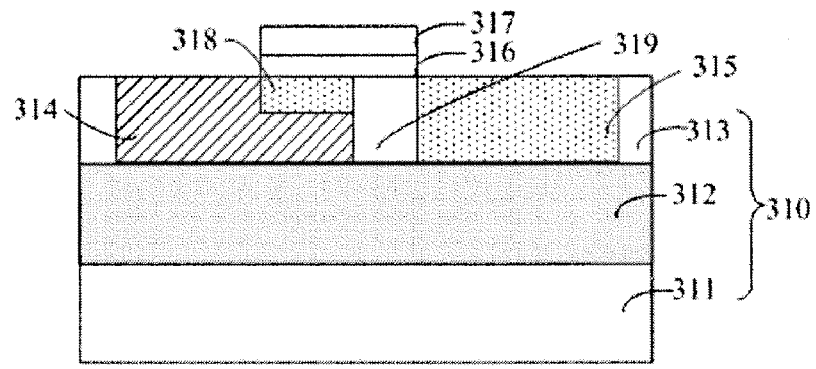
FIG. 3a is a schematic diagram of a conventional gFET.
Figure 3B:
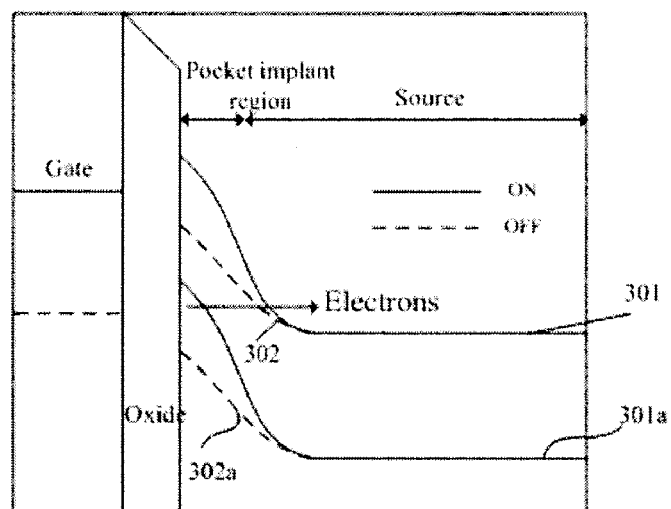
FIG. 3b shows a band diagram of band-bending near the pocket implant region of a p-type gFET and subsequent valence band electrons tunneling into the source.
Figure 3C:
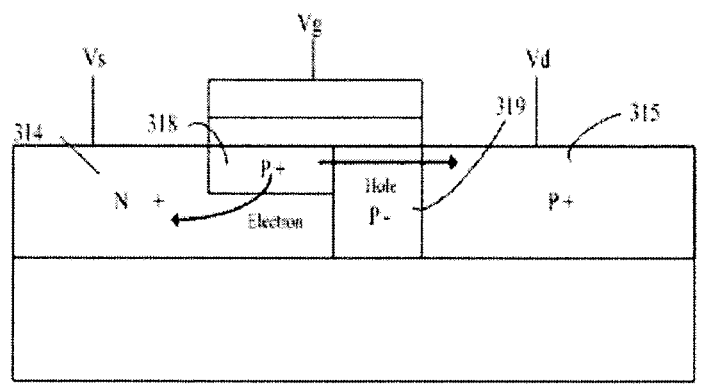
Figure 4A:
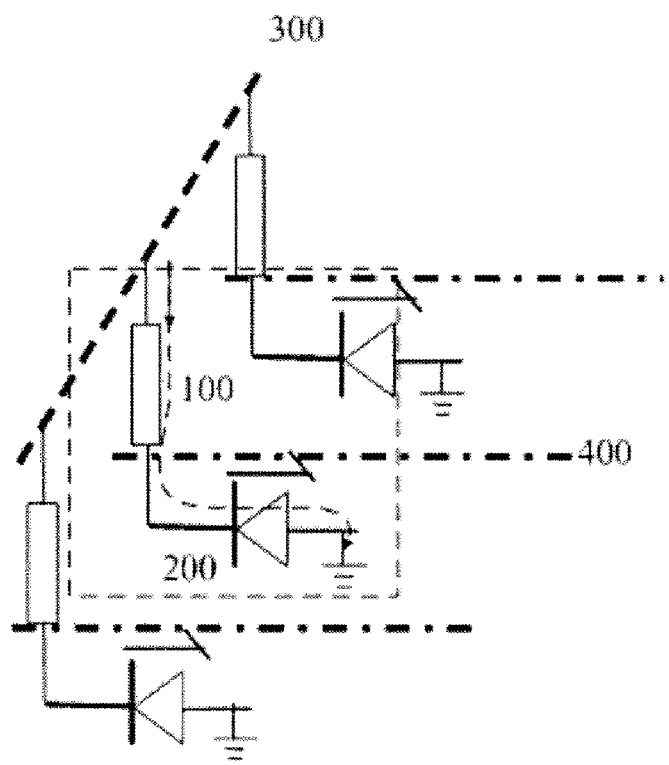
FIG. 4a is a schematic diagram of a first embodiment of the RRAM array of the present invention.
Figure 4B:
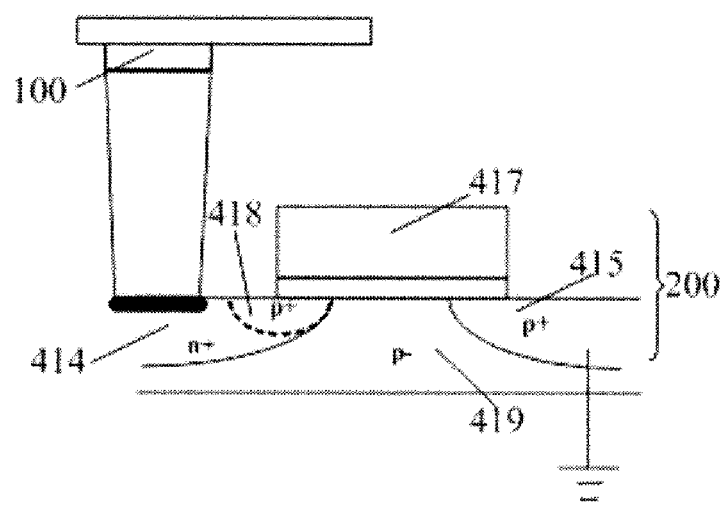
FIG. 4b is a cross-sectional view of the memory cell in the first embodiment of the RRAM array.

FIG. 4a is a schematic diagram of a RRAM array according to the first embodiment of the present invention. FIG. 4b is a cross-section view of one cell of the RRAM array according to the first embodiment of the present invention. With reference to FIGS. 4a and 4b, the RRAM array according to the first embodiment of the present invention includes a plurality of memory cells organized into an array with bit-lines and word-lines. Each memory cell comprises a switching resistor 100 and a gFET 200 serving as a select transistor. In a specific embodiment, the switching resistor 100 has two terminals, one terminal is connected to a bit-line 300, another terminal is connected to the source 414 of gFET 200, a gate 417 connected to a word-line 400, and a drain 415 which is grounded. The memory cell can also be arranged in an alternative manner (not shown in FIGS. 4a and 4b), i.e. one of the terminal of the switching resistor 100 is connected to ground, the other terminal of the switching resistor 100 is connected to the drain 415 of the gFET 200, and the source 414 thereof is connected to a bit-line 300. The memory cell with alternative connection (i.e. simply reversing the order of the resistor and select transistor in FIGS. 4a and 4b) also performs well, and it will not be repeated for simplicity.

The first embodiment of the RRAM array is further described in details below.

Referring to FIGS. 4a and 4b, the gFET 200 is assumed p-type, the source 414 is connected to the switching resistor 100 and the drain 415 is grounded. In order to turn on the p-type gFET for write or read operations, the bit-line 300 is biased to a positive voltage and the word-line 400 is biased to a negative voltage. If the gFET 200 is n-type (not shown in FIG. 4b), the source 414 of the gFET 200 is connected to ground, and the drain is connected to one terminal of the switching resistor 100. The other terminal of the switching resistor 100 is connected to the bit-line 300. The bit-line 300 and the word-line 400 are biased to a positive voltage in order to turn on the n-type gFET for the write or read operation. The p-type gFET includes a $p^+$-type pocket implant region 418, an $n^+$-type source 414, a lightly-doped ($p^-$-type) region 419 and a $p^+$-type drain 415.

We assume p-type gFET in the RRAM cell for the rest of description. The details of RRAM cell with n-type gFET will not be repeated here for simplicity. The method of operating the first embodiment of the RRAM array is described.

When an RRAM cell of the first embodiment is selected to perform a write or read operation, a voltage pulse (with height Vcc/2) is applied to the selected bit-line, and a negative voltage pulse (with height −Vcc/2) is applied to the selected word-line. The negative voltage (−Vcc/2) at the selected wordline (i.e. the voltage at gate 417) results in accumulation at the surface of the p-region 419 and low resistance channel in the gFET 200. During write operation, the total voltage across the bit-line and word-line is Vcc and is large enough to turn on the p-type gFET of the selected cell.

Moreover, in order to avoid write/read disturb on those un-selected memory cells, the un-selected bit-lines 300 and word-lines 400 are grounded. The maximum voltage bias across the gate and source of un-selected gFETs is Vcc/2, and it will not trigger either the channel conduction or the band-to-band tunneling, so that all of those un-selected gFETs 200 are off.

A first method of operating the RRAM array of the first embodiment includes a write operation and a read operation.

Figures 5A, 5B:
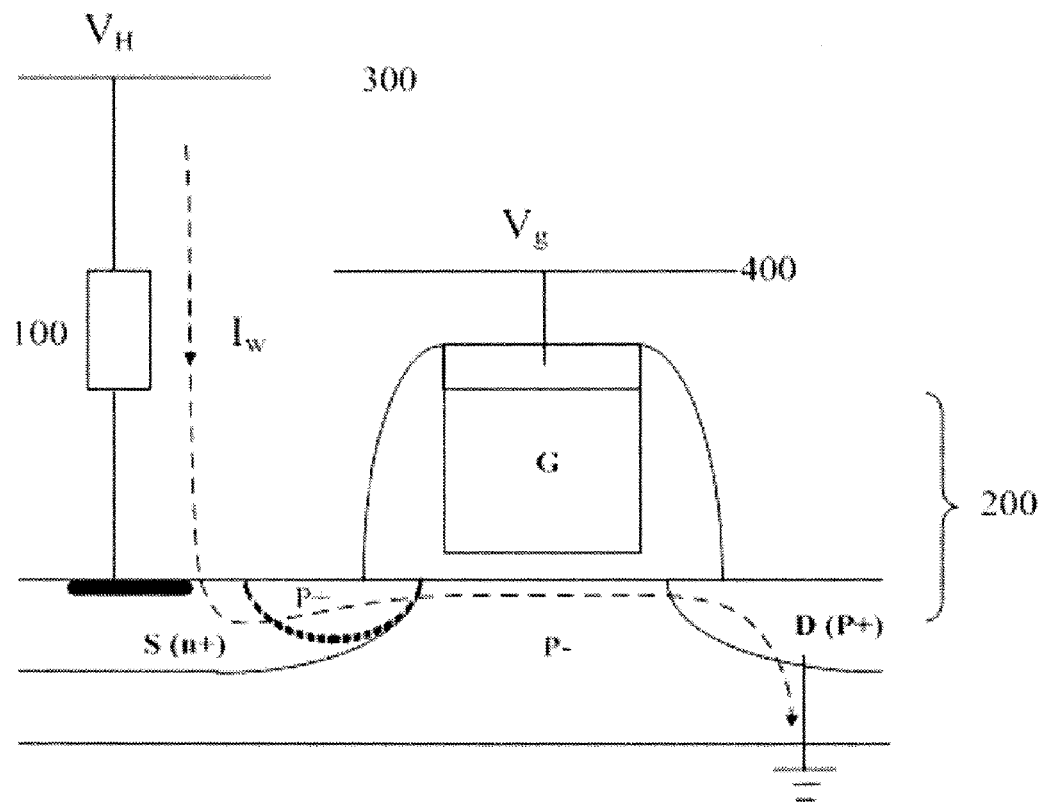
FIG. 5a illustrates the write operation of the first embodiment of the RRAM array.
FIG. 5b is a flow chart of the write operation of the first method according to the present invention.
Figure 7:
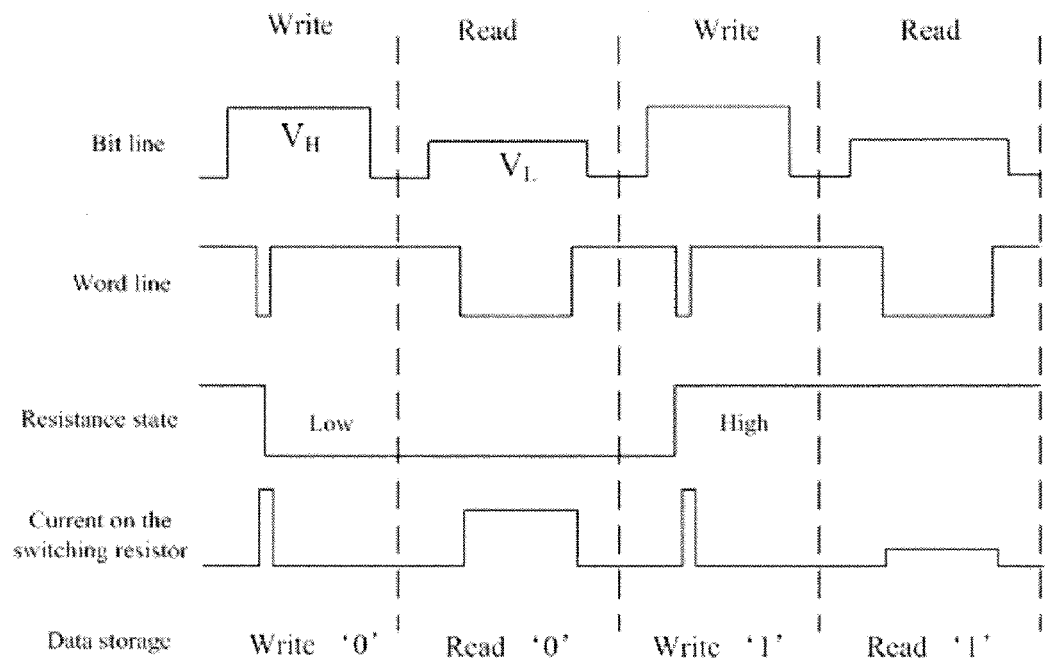
FIG. 7 shows the pulse scheme of the first method of operating the first embodiment of the RRAM array.

FIG. 7 illustrates the waveforms of the first method for operating the first embodiment of the RRAM array. FIGS. 5a and 5b illustrates the current flow and flow chart according to the first embodiment during the write operation. Referring to FIG. 5a, the gFET is assumed p-type, including a $P^+$-type pocket implant region, an $n^+$-type source (S($n^+$)), a lightly-doped ($P^-$-type) region and a $P^+$-type drain (D($P^+$)).

With reference to FIGS. 5a, 5b and 7, the write operation of the first method comprises the following steps:

Step S110, applying a first voltage pulse with pulse height $V_H$ (+Vcc/2) to the bit-line 300. The drain is grounded.

Step S111, applying a second voltage pulse with height $V_g$ (−Vcc/2) to the gate of the gFET 200 through the word-line 400.

If the gate is biased toward more negative with respect to the bias at source, the write current ($I_w$) can be larger for triggering the change of the resistance state of the switching resistor 100. For convenience, data "1" corresponds to a high resistance state of the switching resistor 100, and data "0" corresponds to a low resistance state.

Figures 6A, 6B:
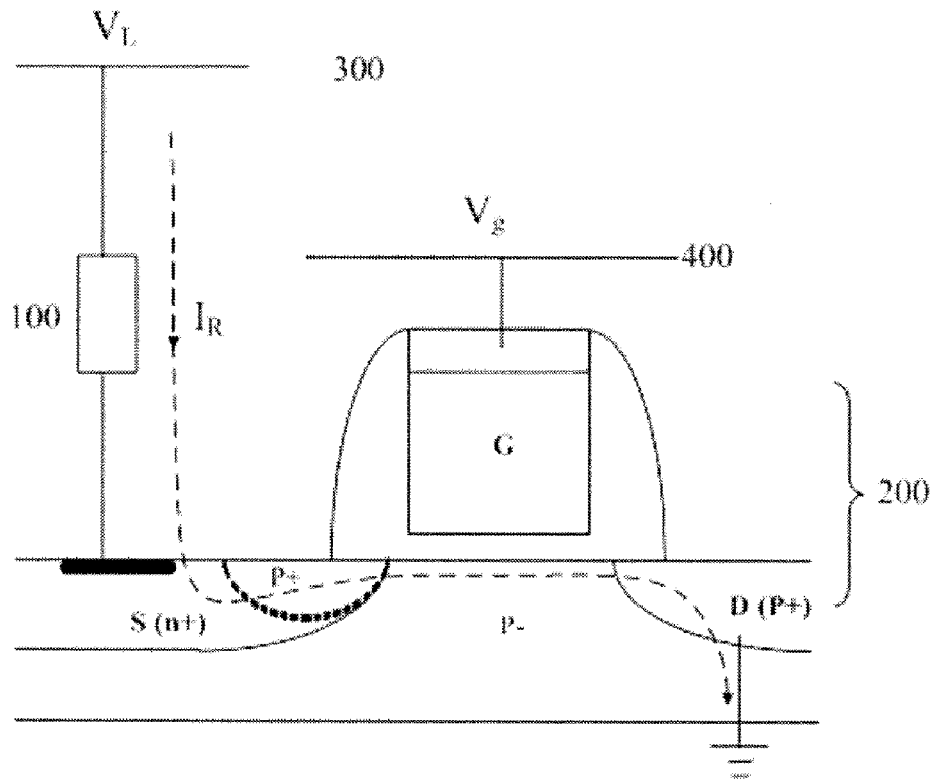
FIG. 6a illustrates the read operation of the first embodiment of the RRAM array.
FIG. 6b is a flow chart of the read operation of the first method according to the present invention.

FIGS. 6a and 6b is illustrates the read current ($I_R$) of the RRAM and a flow chart of the read operation. Referring to FIGS. 6a and 6b, the gFET 200 is assumed p-type. The p-type gFET includes a $P^+$-type pocket implant region, an $n^+$-type source (S($n^+$)), a lightly-doped ($P^-$-type) region and a $P^+$-type drain (D($P^+$)).

With reference to FIGS. 6a, 6b and 7, the read operation of the first method comprises the following steps:

Step S120, applying a third voltage pulse with pulse height $V_L$ (~0.1 v to 1 v) to the bit-line 300 to produce a small voltage across the drain and source of the gFET 200 than in write operation.

The pulse height $V_L$ is large enough to turn on the gFET 200. The read current is small enough (typically at least 10× smaller) than the write current to avoid disturb on the resistance state of the switching resistor 100. The duration of the pulse is in the range of (1 ns to 1 ms) and depending on the sensitivity and response time of the sense amplifier.

Step S121, applying a second voltage pulse with pulse height (−Vcc/2) to the word-line 400 to turn on the gFET 200 so that the read current is measured for reading the data stored in the memory cell.

A larger read current (corresponding to low resistance state) represents data '0', and a smaller read current (corresponding to high resistance state) represents data '1'.

In an alternative embodiment, the determination of the stored data can be simplified if a reference current from periphery circuit is provided (not shown in FIG. 6a), so that the sense amplifier simply compares the read current with respect to the reference current and determine the data "1" or "0" as in above.

It is noted that the conventional gFET structure is not symmetrical in source and drain structure and the current flow after turn-on is uni-directional from source to drain. The present invention proposes that a new gFET with two sources symmetrically sharing one gate stack.

Figure 8A:
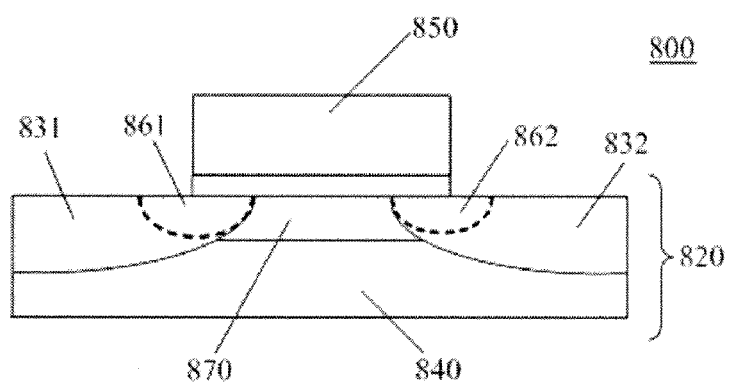
FIG. 8a is a cross-section view of the gFET according to the present invention.

FIG. 8a is a cross-section view of a gFET 800 with two sources and the substrate serves as the drain according to the present invention. With reference to FIG. 8a, the gFET 800 comprises a substrate 820. A gate 850 is formed on the substrate 820 and separated from the substrate 820 by a gate dielectric. A drain 840 is formed under the gate 850 and in the substrate 820. A first source 831 is formed near one side of the gate 850 and in the drain 840. A first pocket implant region 861 is formed in the first source 831. A second source 832 and a second pocket implant region 862 are symmetrically formed under the other side of the gate 850 in the drain 840, and are spaced apart from the first source 861 and the first pocket implant region 861. Both of the first pocket region 861 and the second pocket implant region 862 have the same conductivity as the drain 840, and have the opposite conductivity to the first source 831 and the second source 832.

In order to reduce the leakage current across the pocket implant regions and the drain 840, a lightly-doped region 870 is provided for connecting the drain 840 with the first or the second pocket regions. The lightly-doped region has lower doping concentration than the first and the second pocket implant region, and has the same conductivity as the drain 840. Preferably, the first and the second pocket implant regions are connected to the drain 840 through a common lightly-doped region 870, which is located under the gate 850 and between the first pocket implant region 861 and the second pocket implant region 862.

As shown in FIG. 8a, the first source 831, the first pocket implant region 861, the drain 840 and the gate 850 serve as one conventional gFET, while the second source 832, the second pocket implant region 862, the drain 840 and the gate 850 serve as the other gFET. Therefore, the gFET 800 with two sources can be referred to as "merged green transistor" and serve as two conventional green transistors with parallel connection as illustrated in FIG. 8b.

Figure 8B:
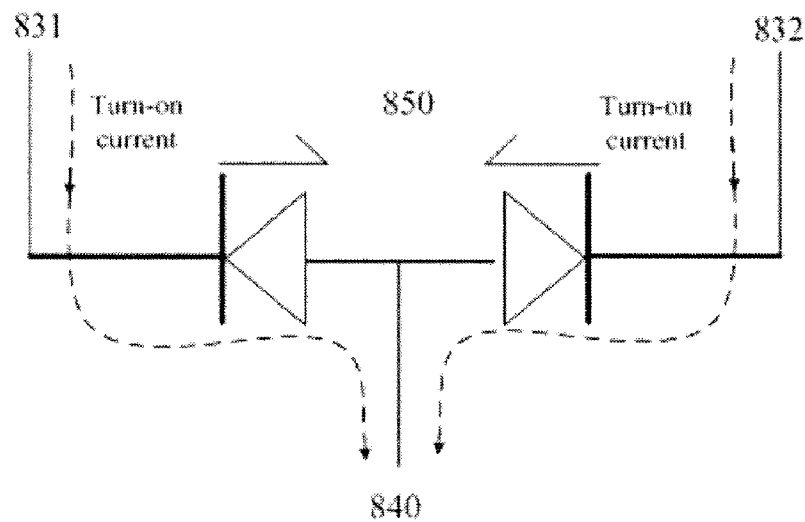
FIG. 8b is a schematic diagram of the gFET according to the present invention.

FIG. 8b is a schematic diagram of the "merged" gFET 800. Referring to FIGS. 8a and 8b, both of the two parallel gFETs can be turned on independently by applying different voltages at the sources 831 and 832 respectively but sharing the same voltage at the gate 850. Moreover, the two parallel transistors have the same threshold voltage if the gFET 800 is fully symmetrical, e.g., the first source 831 and the second source 832 have the same dopant and concentration. If the voltage at gate is more negative than one source in the merged gFET 800 by a "threshold" of voltage, the carriers in the corresponding pocket implant regions tunnel into the source, forming turn-on currents, and turn on the corresponding one gFET related to the source. Therefore, the two parallel gFET corresponding to both sources can be turned on independently or simultaneously.

According to some embodiments of the present invention, the merged gFET 800 may be classified as p-type or n-type transistors in terms of the conductivity of the pocket implant region. We assume p-type merged gFET in the following text for simplicity.

Figure 9A:
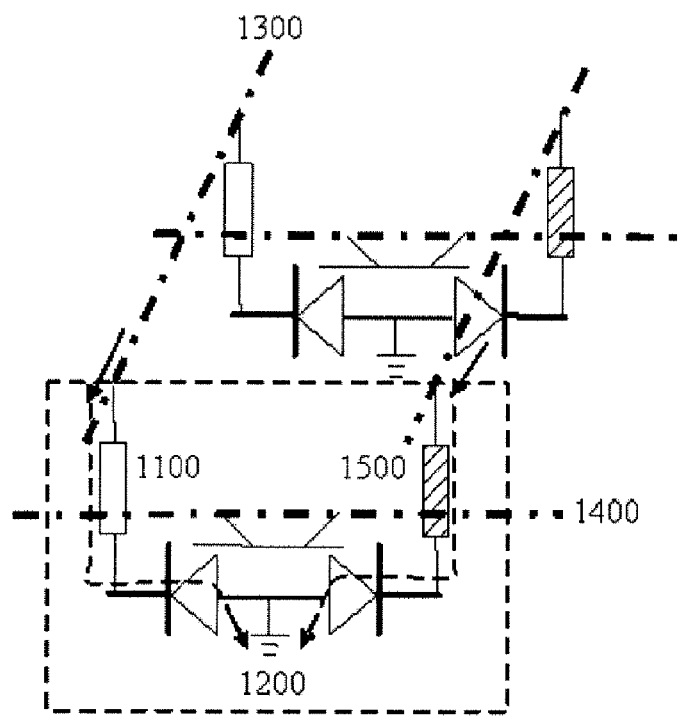
FIG. 9a is a schematic diagram of a second embodiment of the RRAM array according to an embodiment of the present invention.
Figure 9B:
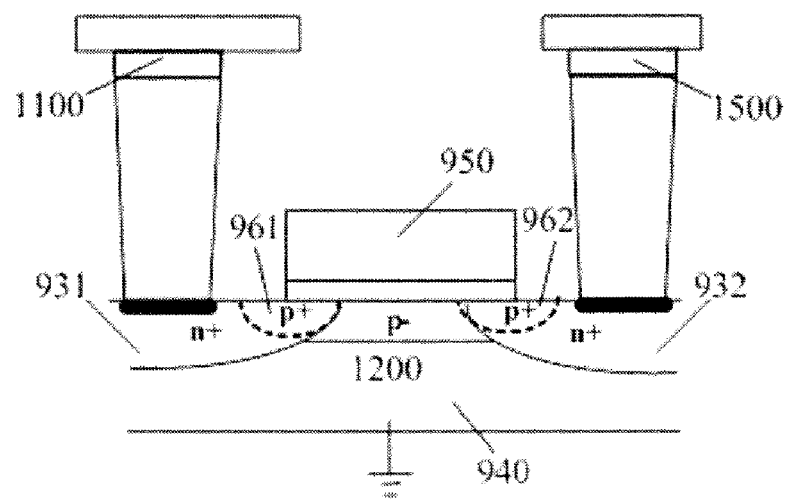
FIG. 9b is a cross-section view of the second embodiment of the RRAM array.

Similar to the conventional gFET, the merged gFET 800 can be used as the select transistor for RRAM cell. FIG. 9a is a schematic diagram of the RRAM array according to a second embodiment of the present invention. FIG. 9b is a schematic cross-section view of one RRAM cell with the new merged gFET as select transistor in FIG. 9a. With reference to FIGS. 9a and 9b, the RRAM array of the second embodiment of the present invention includes a plurality of memory cells arranged in array with bit-lines and word-lines. Each memory cell comprises a merged gFET 1200 including a gate 950, a first source (n⁺) 931, a second source (n⁺) 932, a lightly-doped region (p⁻), a first pocket implant region (p⁺) 961, a second implant region (p⁺) 962 and a drain 940; a switching resistor 1100 including a first terminal and a second terminal; and a reference resistor 1500 including a third terminal and a fourth terminal. Both of the first terminal of the switching resistor 1100 and the third terminal of the reference resistor 1500 are connected to a bit-line 1300. The second terminal of the switching resistor 1100 is connected to the first source 931 of the gFET 1200. The fourth terminal of the reference resistor 1500 is connected to the second source 932 of the gFET 1200. The gate 950 of the gFET 1200 is connected to a word-line 1400.

The reference resistor 1500 is made of common material (i.e. non-switching materials in CMOS flow, such as poly, or metal) and has a constant resistance value within the range of the bi-stable resistance states of the switching resistor 1100. In other words, the resistance of the reference resistor 1500 is in between the high and low resistance states of the switching resistor 1100. Further, the resistance of the reference resistor 1500 is carefully set to be large enough, so that the read current through the switching resistor 1100 is small enough to avoid disturb or degradation of the resistance states.

According to this embodiment, the drain 950 is grounded and the gFET 1200 is assumed p-type with two sources. A second method of operating the RRAM array of the second embodiment will be further described in the following paragraph, which includes a write operation and a read operation.

Figure 10A:
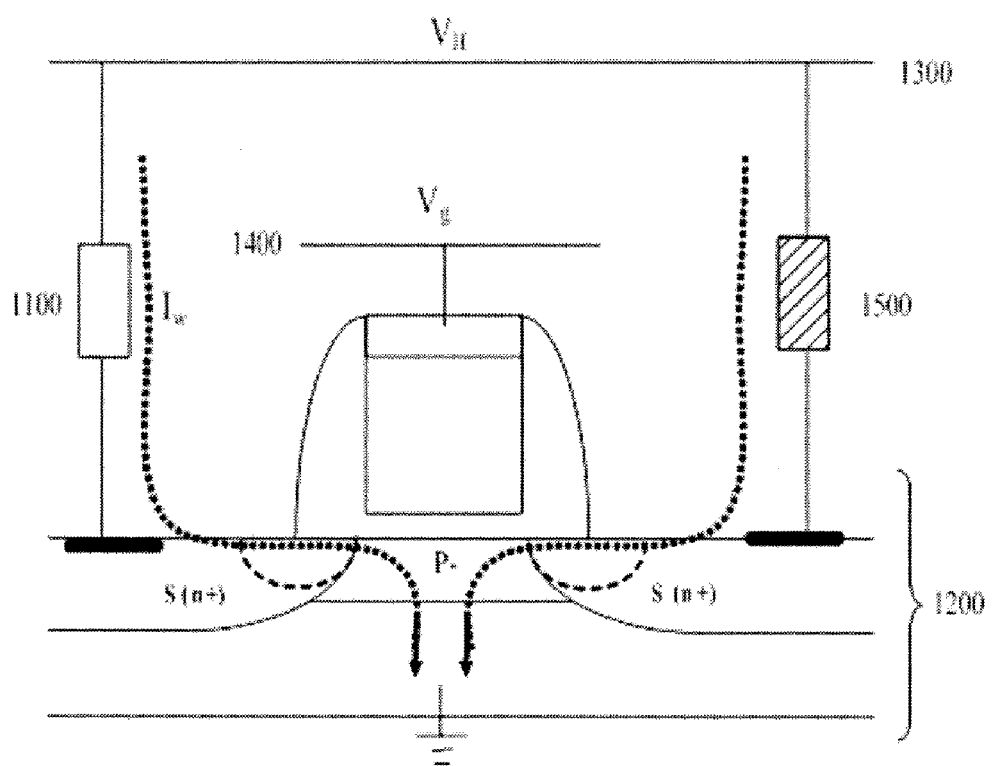
FIG. 10a illustrates the write operation of the second embodiment of the RRAM array.
Figures 10B, 11A:
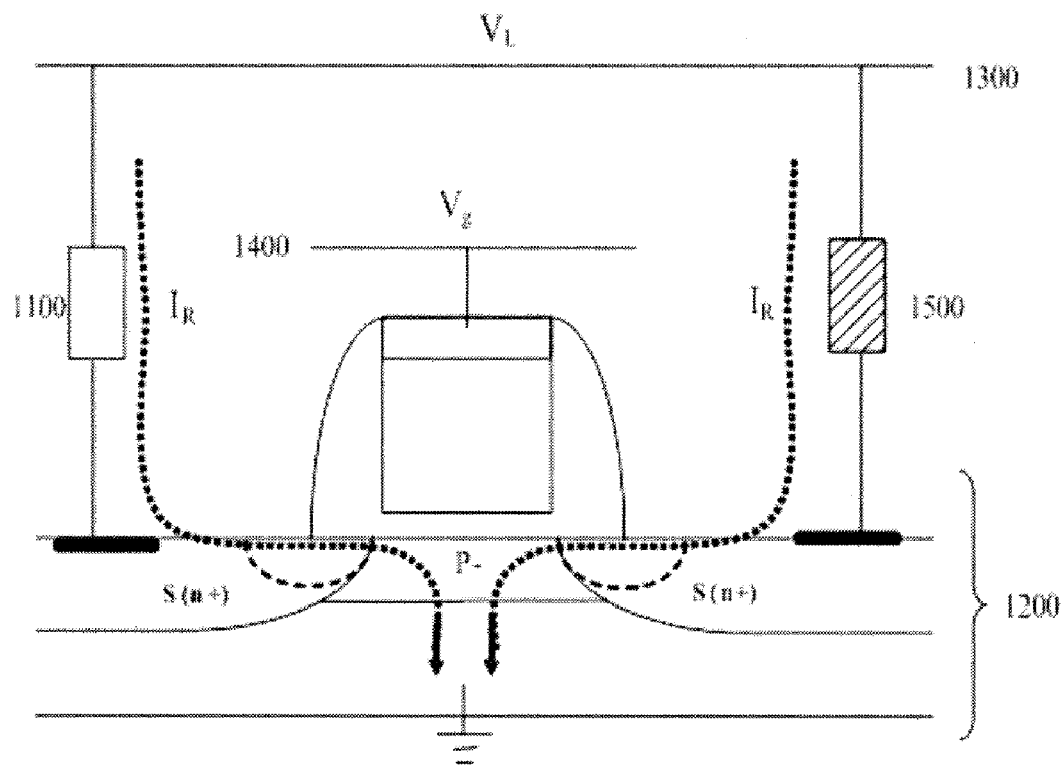
FIG. 10b is a flow chart of the write operation of the second method according to the present invention.
FIG. 11a illustrates the read operation of the second embodiment of the RRAM array.
Figure 12:
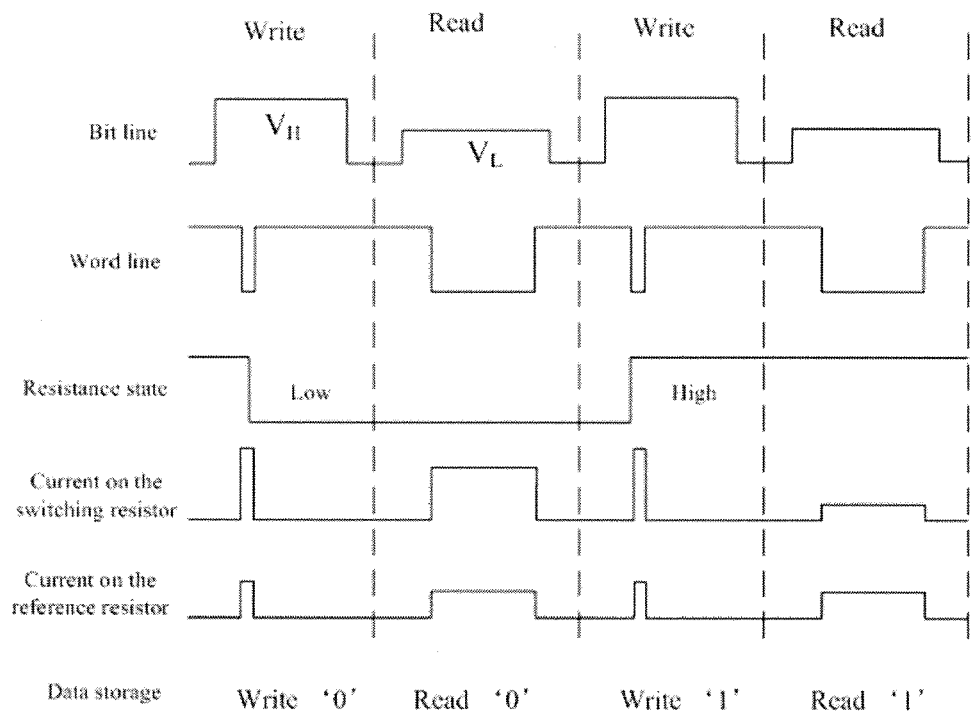
FIG. 12 shows the pulse scheme of the second method of operating the second embodiment of the RRAM array.

FIG. 12 illustrates the waveform of the second method of operating the RRAM array of the second embodiment. FIG. 10a illustrates the write operation of the RRAM array of the second embodiment. FIG. 10b is a flow chart of the write operation of the second method according to the present invention. The p-type gFET 1200 includes two n⁺-type sources (S(n⁺)), a lightly-doped region (P⁻-type).

With reference to FIGS. 10a, 10b and 12, the write operation of the second method comprises the following steps:

Step S210, applying a first positive voltage pulse with pulse height $V_H$ (+Vcc/2) to the bit-line 1300. The drain is grounded.

Step S211, applying a second negative voltage pulse with pulse height $V_g$ (−Vcc/2) to the gate of the gFET 1200 through the word-line 1400 so that a large enough negative voltage at the gate with respect to the source is established to turn on the gFET 1200. A large write current ($I_w$) pulse flows through the switching resistor 1100 for triggering the change of the resistance state. There is also current flow through the reference resistor.

For convenience, a high resistance state of the switching resistor represents data '1' and a low resistance state represents data '0' respectively. The resistance of the reference resistor 1500 is in between the high and low resistance of the switching resistance and is not changed during the write operation.

Figure 11B:
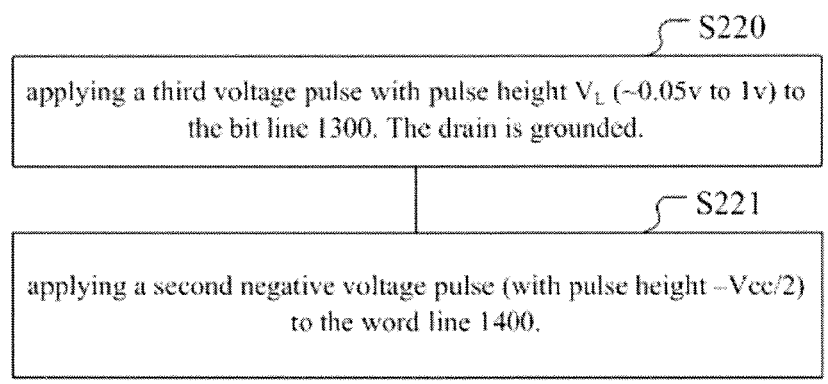
FIG. 11b is a flow chart of the read operation of the second method according to the present invention.

FIG. 11*a* illustrates the read operation of the RRAM array. FIG. 11*b* is a flow chart of the read operation of the second method. The p-type gFET 1200 includes two n$^+$-type sources (S(n$^+$)), a lightly-doped region (P$^-$-type).

With reference to FIG. 11*a*, 11*b* and 12, the read operation of the second method comprises the following steps:

Step S220, applying a third voltage pulse with pulse height V$_L$ (~0.05 v to 1 v) to the bit-line 1300. The drain is grounded.

Step S221, applying a second negative voltage pulse (with pulse height −Vcc/2) to the word-line 1400. The negative bias from the gate to the source is large enough in magnitude to turn on the gFET 1200 and to result in the read current I$_R$ (as set by the bit-line bias and the resistance state) as well as the reference current I$_{R'}$. The read current shall be large enough for sense-amplifier and also small enough to avoid degradation of resistance state during the read operation.

The data stored in the second embodiment of the RRAM array are read by comparing the read current I$_R$ through the switching resistor 1100 with respect to the reference current I$_{R'}$ through the reference resistor 1500. For example, a larger read current corresponding to a low resistance state represents data '0'; and a smaller read current corresponding to a high resistance state represents data '1'. Note that each cell has its own reference current for read operation.

The RRAM array of the second embodiment discussed in the foregoing paragraph is 1T1R cell. The gFET of the RRAM array has two sources serving as two parallel transistors. According to the third embodiment of the present invention, an RRAM cell can store 2 bits by replacing the reference resistor into a switching resistor. The RRAM array of the third embodiment makes full use of the two sources of the new gFET, thereby doubling the memory density.

Figure 13A:
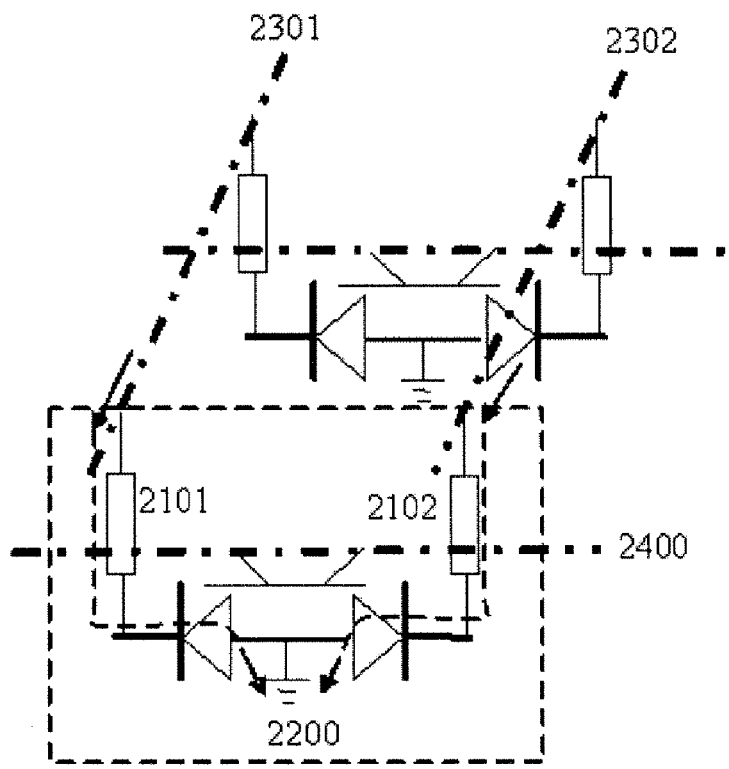
FIG. 13a is a schematic diagram of the third embodiment of the RRAM array according to an embodiment of the present invention.
Figure 13B:
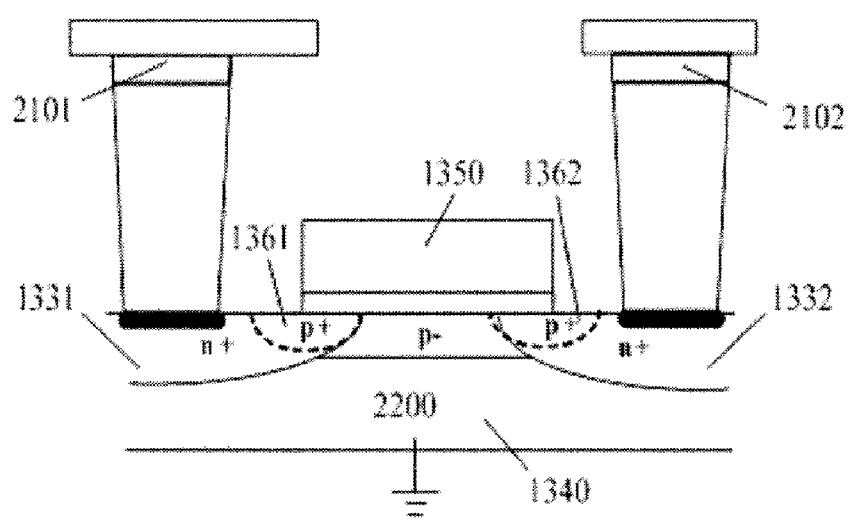
FIG. 13b is a cross-sectional view of the third embodiment of the RRAM array.

FIG. 13*a* is a schematic diagram of the RRAM array according to the third embodiment of the present invention. FIG. 13*b* is a schematic cross-section view of the RRAM cell. With reference to FIGS. 13*a* and 13*b*, the RRAM array includes a plurality of memory cells organized into array with bit-lines and word-lines, each memory cell comprise a "merged" gFET 2200, a first switching resistor 2101 including a first terminal and a second terminal, a second switching resistor 2102 including a third terminal and a fourth terminal. The gFET 2200 includes a gate 1350, a first source (n$^+$) 1331, a second source (n$^+$) 1332, a lightly-doped region (p$^-$), a first pocket implant region (p$^+$) 1361, a second pocket implant region (p$^+$) 1362 and a drain 1340. The first terminal is connected to a first bit-line 2301. The second terminal is connected to the first source 1331 of the gFET 2200. The third terminal is connected to a second bit-line 2302. The fourth terminal is connected to the second source 1332 of the gFET 2200. The gate 1350 of the gFET 2200 is connected to a word-line 2400.

The drain 1340 is grounded or connected to an external power supply. Moreover, the gFET 2200 is assumed p-type for simplicity. A third method for operating the RRAM array of the third embodiment includes a write operation and a read operation. Since each memory cell of the RRAM array of the third embodiment stores 2-bit data by utilizing the first and the second switching resistors, the third method for operating the RRAM array of the third embodiment is similar to the first method of operating the RRAM array of the first embodiment.

Figures 14A, 14B:
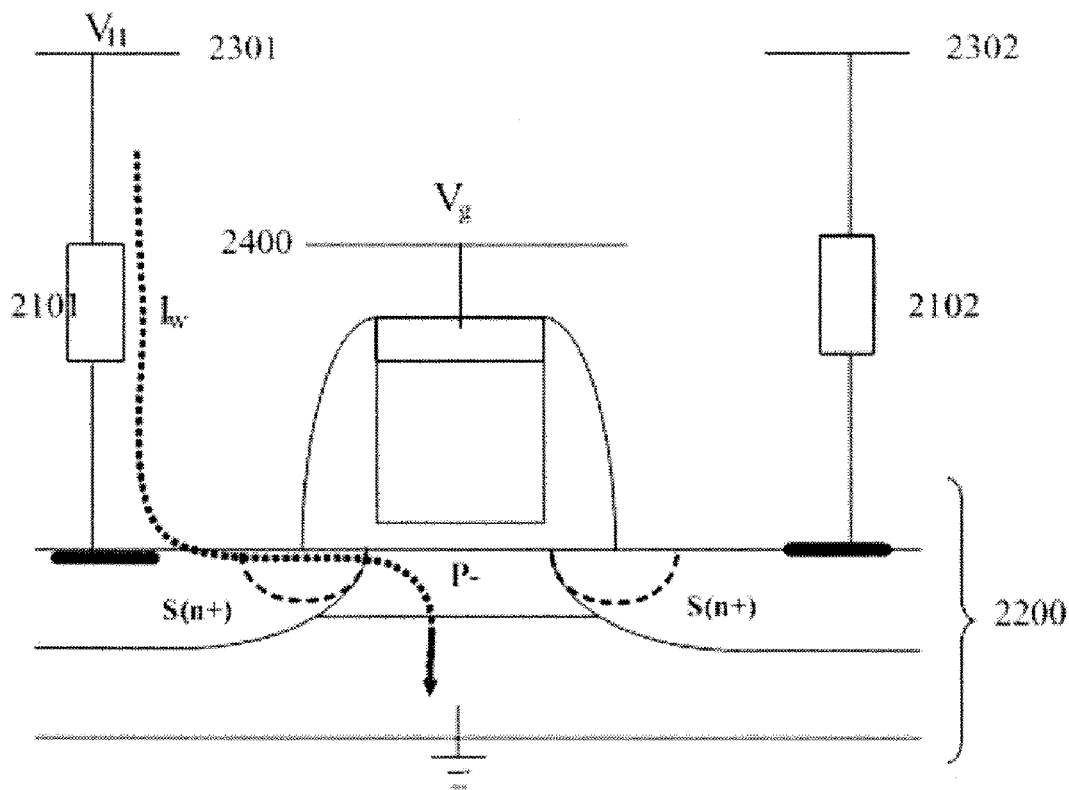
FIG. 14a illustrates the write operation of the third embodiment of the RRAM array.
FIG. 14b is a flow chart of the write operation of the third method according to the present invention.
Figure 16:
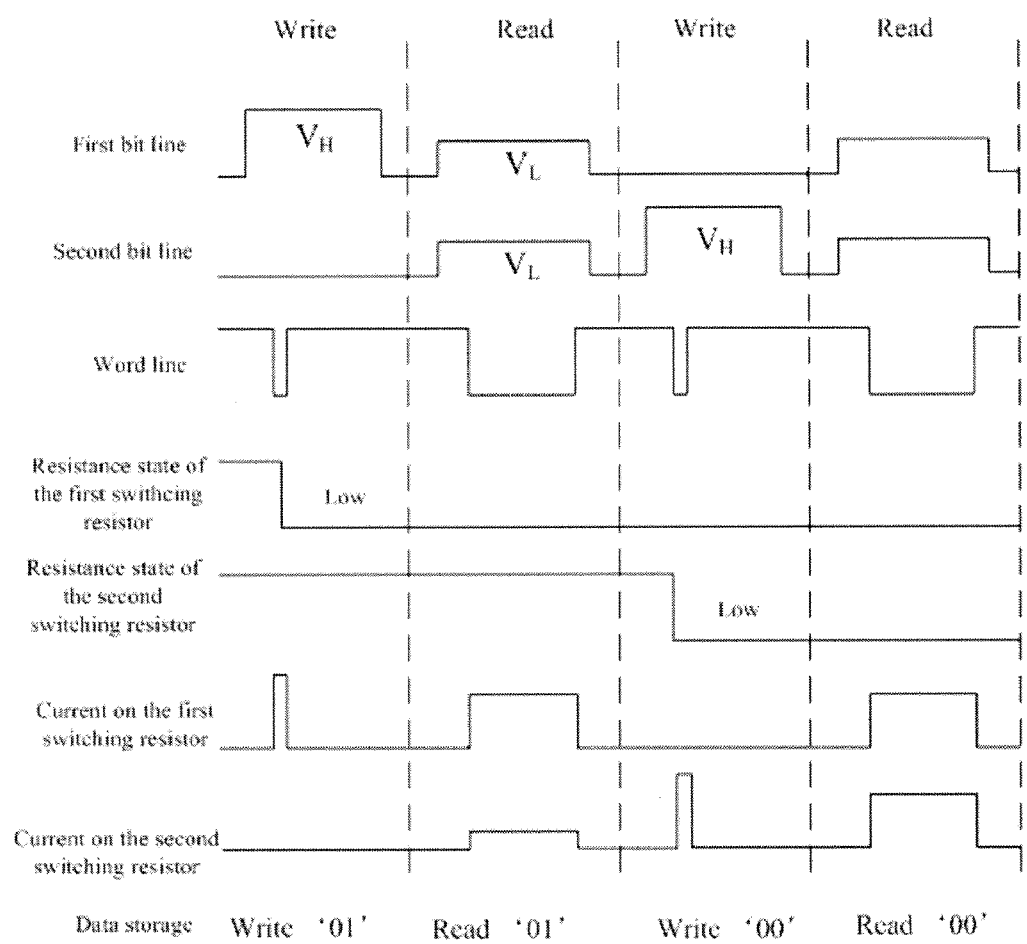
FIG. 16 shows the pulse scheme of the third method of operating the third embodiment of the RRAM array. FIG.

FIG. 16 illustrates waveforms for the third method for operating the RRAM array of the third embodiment. FIG. 14*a* illustrates the write operation of the RRAM array of the third embodiment. FIG. 14*b* is a flow chart of the write operation of the third method. Each memory cell comprises a first switching resistor 2101 and a second switching resistor 2102. The p-type gFET 2200 includes two n$^+$-type sources (S(n$^+$)), a lightly-doped region (P$^-$-type).

With reference to FIGS. 14*a*, 14*b* and 16, the write operation of the third method comprises the following steps:

Step S310, applying a first voltage pulse with pulse height V$_H$ (+Vcc/2) to the first bit-line 2301 or the second bit-line 2302. The drain is grounded.

Step S311, applying a second voltage pulse with pulse height V$_g$ (−Vcc/2) to the gate of the gFET 2200 through the word-line 2400 to turn on the gFET 2200 transiently. The write current (I$_w$) pulse is large enough to change the resistance state of the switching resistors. The write operation of the first and the second switching resistor can be implemented separately or simultaneously.

Similar to the first method of operating the first embodiment of the RRAM array, A high resistance state of the switching resistor represents data '1' and a low resistance state represents data '0' correspondently. Therefore, the 2-bit data stored in the memory cell of the RRAM array can represent '00', '01', '10' or '11', respectively.

Figures 15A, 15B:
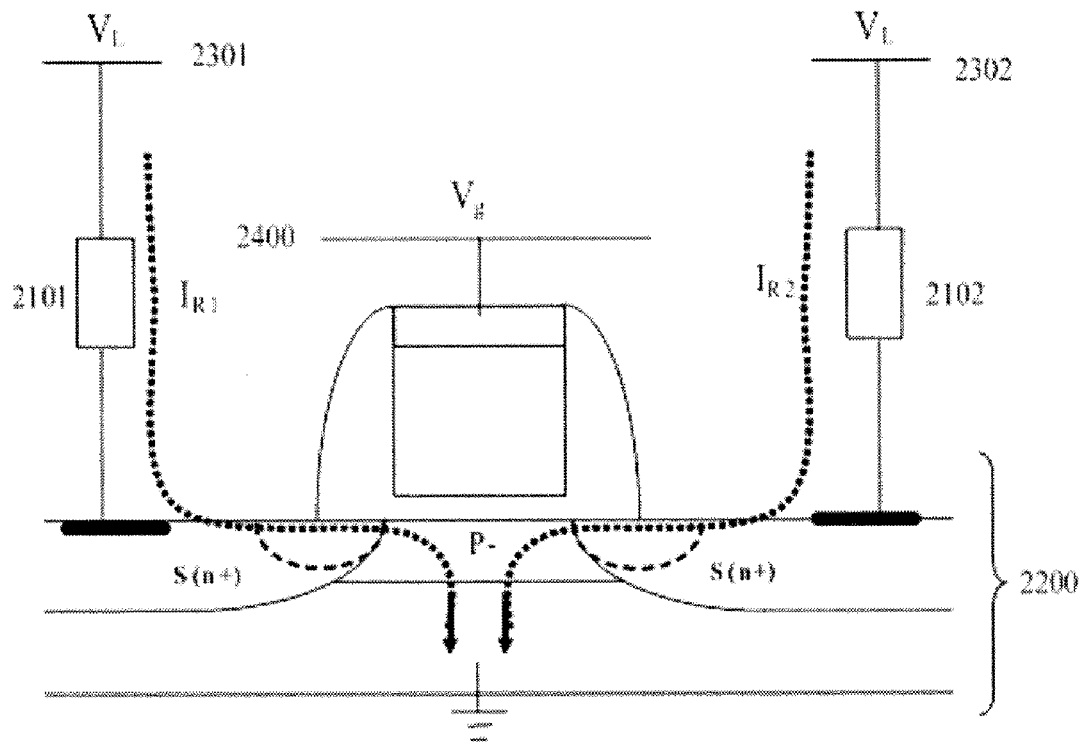
FIG. 15a illustrates the read operation of the third embodiment of the RRAM array.
FIG. 15b is a flow chart of the read operation of the third method according to the present invention.

FIGS. 15*a* and 15*b* illustrates the read operation in the RRAM array and the flow chart for the third embodiment. The p-type gFET 2200 includes two n$^+$-type sources (S(n$^+$)), a lightly-doped region (P$^-$-type).

With reference to FIGS. 15*a*, 15*b* and 16, the read operation of the third method comprises the following steps:

Step S320, applying a third voltage pulse with pulse height V$_L$ (~0.1 v to 1 v) to the first bit-line 2301 or second bit-line 2302. The drain is grounded.

Step S321, applying a second voltage pulse with pulse height (−Vcc/2) to the word-line 2400 to turn on the gFET 2200 in order to produce the read currents through the first and the second switching resistors for reading the data stored in the memory cell. The third voltage V$_L$ is large enough to the sense amplifier and small enough to avoid disturb on the resistance state of the switching resistors during the read operation.

The data stored in the third embodiment of the RRAM array can be read by measuring the read currents (I$_{R1}$ and I$_{R2}$) on the two switching resistors or comparing each respective current with respect to a reference current (from periphery circuit) in sequential manner or simultaneously. Similarly, a larger read current with respect to the reference current (corresponding to a low resistance state) represents data '0'; and a smaller read current (corresponding to a high resistance state) represents data '1'.

As discussed before, if the resistance states in the switching resistors are stored in opposite manner in pairs (i.e. "10" or "01"), then the two data storage cases can be regarded as 1 bit of data and determined by comparing the first with respect to the second read current without the need of a reference current. In this case, the sensing scheme is simplified and the sensing speed is fast in ns range.

A fourth method for operating the RRAM array of the third embodiment includes a write operation and a read operation.

Figure 19:
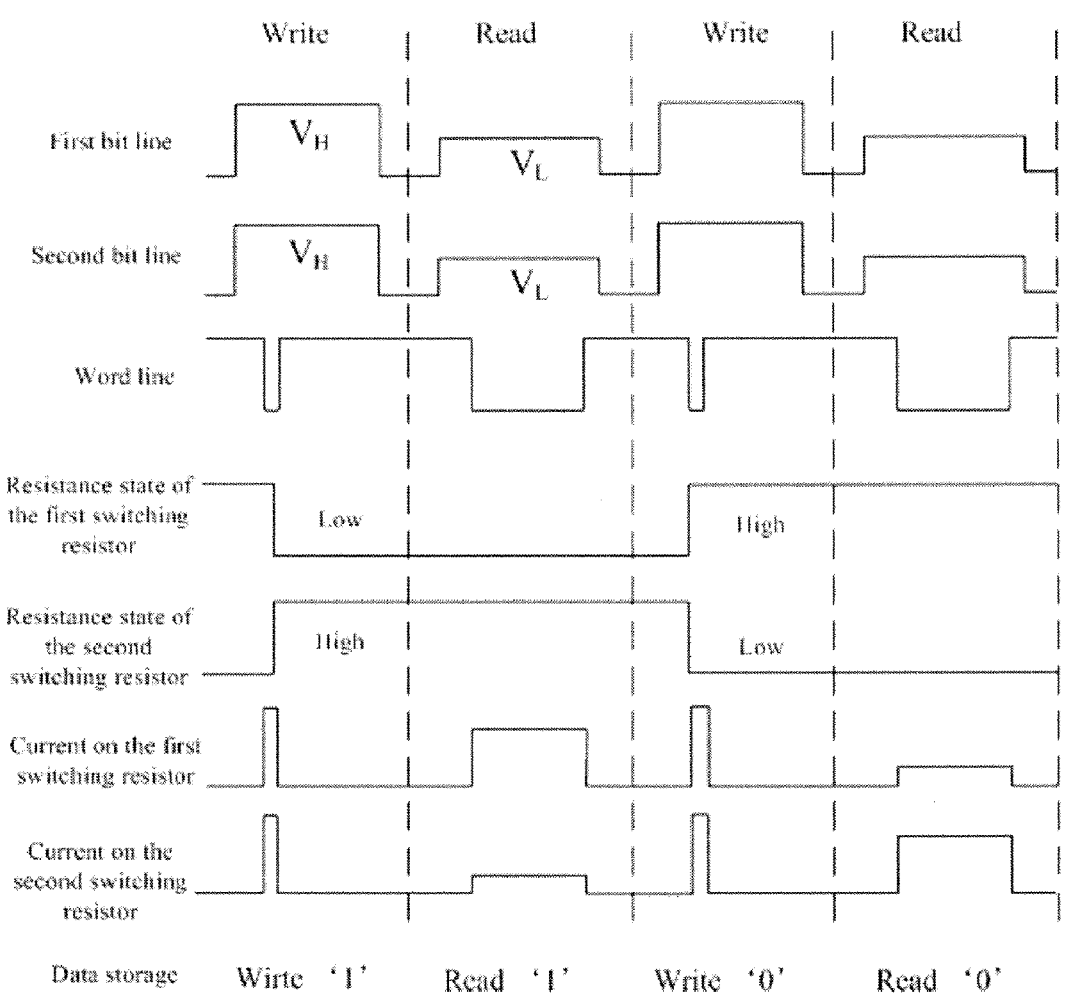
FIG. 19 shows the pulse scheme of the fourth method of operating the third embodiment of the RRAM array.

FIG. 19 illustrates the waveforms of the fourth method of operating the RRAM array of the third embodiment. FIGS. 17*a* and 17*b* illustrates the write operation of the RRAM cell and the flow chart for the third embodiment. The p-type gFET 2200 includes two n$^+$-type sources (S(n$^+$)), a lightly-doped region (P$^-$-type).

With reference to FIGS. 17a, 17b and 19, the write operation of the third method comprises the following steps:

Step S410: applying a first voltage pulse to the first bit-line 2301, and applying a second voltage pulse to the word-line 2400 to turn on the gFET 2200. The high write current pulse triggers the change of the resistance state and stores data into the first switching resistor. Repeat the above procedure and store the opposite resistance state (than the first switching resistor) into the second switching resistor.

Step S411: applying a first voltage pulse with pulse height $V_H$ (+Vcc/2) to the first bit-line 2301. The second bit-line 2302 is grounded. The drain is grounded.

Step S412: applying a second voltage pulse with pulse height $V_g$ (−Vcc/2) to the gate of the gFET 2200 through the word-line 2400 to turn on the gFET 2200, The writing current ($I_w$) pulse triggers resistance change in the first switching resistors. The pulse duration at the gate pulse determines the data written in the resistor is "1" or "0".

Repeat the above procedure and store the opposite data into the second switching resistor. Thus, the first and the second switching resistors store data "10" or "01" and represent 1-bit of storage. In an embodiment, the write operation of the first and the second switching resistor is performed in sequential manner.

Figures 18A, 18B:
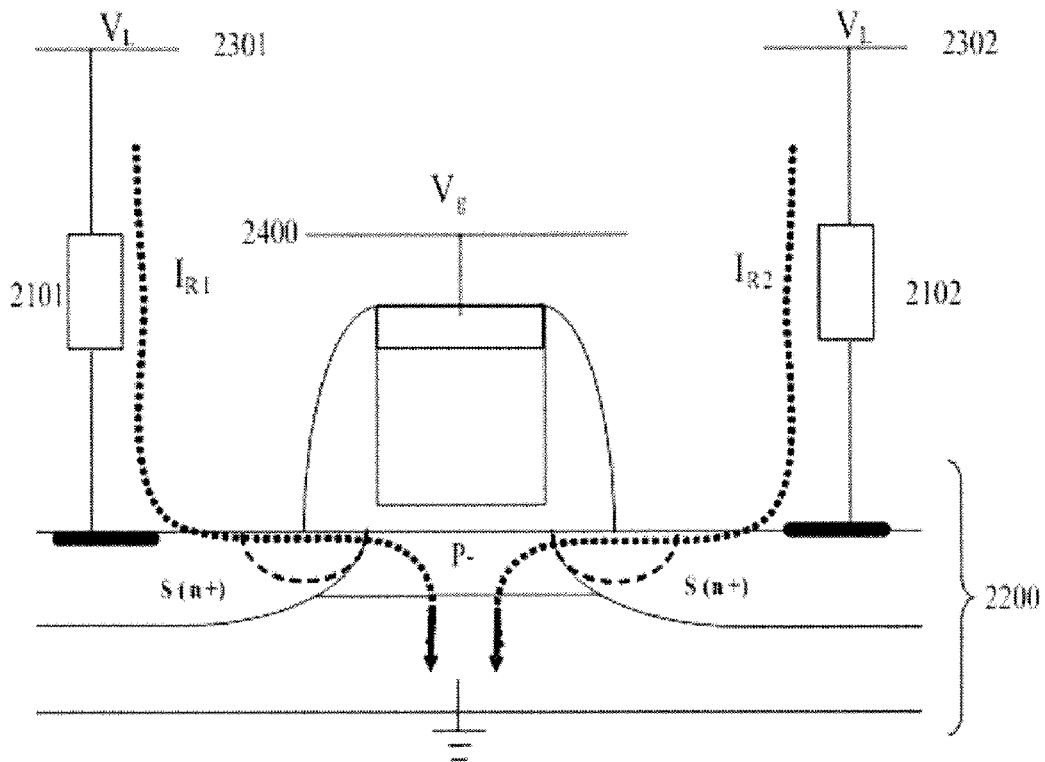
FIG. 18a illustrates the read operation of the third embodiment of the RRAM array.
FIG. 18b is a flow chart of the read operation of the fourth method according to the present invention.

FIGS. 18a and 18b illustrates the read current in the RRAM cell and a flow chart of the read operation. The p-type gFET 2200 includes two n$^+$-type sources (S(n$^+$)), a lightly-doped region (P$^-$-type). With reference to FIGS. 18a, 18b and 19, the read operation of the fourth method comprises the following steps:

Step S420: applying a third voltage pulse with pulse height $V_L$ (0.1 v to 1 v) to the first bit-line 2301 and the second bit-line 2302. The drain is grounded.

Step S421, applying a second voltage pulse with pulse height (−Vcc/2) to the word-line 2400 to turn on the gFET 2200 to trigger the read currents in the first and the second switching resistors. The read current is large enough for sense amplifier to detect, and also small enough to avoid degradation of the resistance states in the switching resistor.

The two pairs of data storage (i.e. "10" or "01" as regarded as 1 bit of data can be determined by comparing the first and the second read currents ($I_{R1}$ and $I_{R2}$) without the need of a reference current. Also, the sensing scheme is simplified and fast in ns range. Date "0" is represented by a larger first read current (than) the second read current, and data "1" is represented by a smaller first read current.

The present invention achieves many benefits over conventional techniques. For example, the gFET serving as select transistors, the RRAM presented in this invention has superior scalability for resistor as well as transistor, leading to a memory array with high density. Besides, the power consumption of select transistors can be greatly reduced.

The present invention has been described in conjunction with the preferred embodiments which, however, do not limit the invention. Various modifications and supplements may be made to the preferred embodiments by the ordinary skill in the art without departing from the spirit and scope of invention as set forth in the appended claims.

What is claimed is:

1. A green MOSFET transistor (gFET comprising:
    a substrate;
    a gate formed on the substrate, and separated from the substrate by a gate dielectric;
    a drain formed under the gate and in the substrate;
    a first source formed near one side of the gate and in the drain;
    a first pocket implant region formed in the first source; and
    a second source and a second pocket implant region formed under the other side of the gate in the drain symmetrically, spaced apart from the first source and the first pocket implant region,
    wherein both of the first and the second pocket implant region have the same conductivity as the drain, and have the opposite conductivity to the first and the second source.

2. The gFET as claimed in claim 1, wherein a lightly-doped region connects at least one of the first and the second pocket implant region to the drain, and has lower doping concentration than the first and the second pocket implant region, and the same conductivity as the drain.

3. The gFET as claimed in claim 2, wherein the first and the second pocket implant region are connected to the drain through a same lightly-doped region, and the lightly-doped region is located between the first and the second pocket implant region in the drain.

4. A resistive random access memory applying the gFET as claimed in claim 1, including a plurality of memory cells arranged in array with bit-lines and word-lines, each memory cell comprising:
    a gFET including a gate, a first source, a second source and a drain;
    a switching resistor including a first terminal and a second terminal;
    a reference resistor including a third terminal and a fourth terminal;
    wherein the first terminal and the third terminal of the switching resistor is connected to a bit-line, the second terminal of the switching resistor being connected to a first source of the gFET, the fourth terminal of the reference resistor being connected to the second source of the gFET, and the gate of the gFET being connected to a word-line.

5. The resistive random access memory as claimed in claim 4, wherein the reference resistor has a constant resistance, which is smaller than the high resistance and larger than the low resistance of the switching resistor.

6. The resistive random access memory as claimed in claim 4, wherein the drain of the gFET is grounded or is connected to an external power supply.

7. The resistive random access memory as claimed in claim 4, wherein the gFET is n-type or p-type.

8. The resistive random access memory as claimed in claim 7, wherein when the memory cell is turned on, gate voltage is lower than source voltage, and difference across the gate and the first source, and difference across the gate and the second source are both larger than the threshold voltage to turn on the gFET.

9. A method of operating the resistive random access memory as claimed in claim 4, comprising:
    a write operation comprising steps of:
    applying a first positive voltage pulse with pulse height to the bit-line, the drain being grounded; and
    applying a second negative voltage pulse with pulse height to the gate of the gFET through the word-line so that a large enough negative voltage at the gate with respect to the source is established to turn on the gFET; and
    a read operation comprising steps of:
    applying a third voltage pulse with pulse height to the bit-line;
    applying a second negative voltage pulse to the word-line, wherein negative bias from the gate to the source is large enough in magnitude to turn on the gFET and to result in a read current $I_R$ and a reference current $I_{R'}$, the read current being large enough for sense-amplifier and also small enough to avoid degradation of resistance state during the read operation; and comparing the read current $I_R$ through the switching resistor with respect to the reference current $I_{R'}$ through the reference resistor for reading the data stored in the memory cell.

10. The method of operating the resistive random access memory as claimed in claim 9, wherein during the write operation, a high resistance state of the switching resistor represents data '1' and a low resistance state represents data '0'.

11. The method of operating the resistive random access memory as claimed in claim 10, wherein during the read operation,
- a first state that a current through the switching resistor is larger than a current through the reference resistor represents data '0',
- a second state that a current through the switching resistor is smaller than a current through the reference resistor represents data '1', and
- if a current through the switching resistor equals to a current through the reference resistor, data are defined according to the resistance state of the reference resistor.

12. A resistive random access memory applying the gFET as claimed in claim 1 including a plurality of memory cells arranged in array with bit-lines and word-lines, each memory cell comprising:
- a gFET including a gate, a first source, a second source and a drain;
- a first switching resistor including a first terminal and a second terminal; and
- a second switching resistor including a third terminal and a fourth terminal;
- the first terminal of the first switching resistor being connected to a first bit-line, the second terminal of the first switching resistor being connected to the first source of the gFET,
- the third terminal of the second switching resistor being connected to a second bit-line, the fourth terminal of the second switching resistor being connected to the second source of the gFET,
- the gate of the gFET being connected to a word-line.

13. The resistive random access memory as claimed in claim 12, wherein the drain of the gFET is grounded or is connected to an external power supply.

14. The resistive random access memory as claimed in claim 12, wherein the gFET is n-type or p-type.

15. The resistive random access memory as claimed in claim 14, wherein when the memory cell is turned on, the gate voltage is lower than the source voltage, and difference across the gate and the first/second source is larger than threshold voltage of the gFET.

16. A method of operating the resistive random access memory as claimed in claim 12, comprising:
- a write operation comprising steps of:
  - applying a first voltage pulse with pulse height to the first bit-line or the second bit-line, the drain being grounded; and
  - applying a second voltage pulse with pulse height to the gate of the gFET through the word-line to turn on the gFET transiently, writing current pulse being large enough to change the resistance state of the switching resistors, the write operation of the first and the second switching resistor being implemented separately or simultaneously; and
- a read operation comprising steps of:
  - applying a third voltage pulse with pulse height to the first bit-line or second bit-line, the drain being grounded;
  - applying a second voltage pulse with pulse height to the word-line to turn on the gFET in order to produce read currents through the first and the second switching resistors for reading the data stored in the memory cell, the third voltage pulse being large enough to the sense amplifier and small enough to avoid disturb on the resistance state of the switching resistors during the read operation; and
  - measuring the read currents on the first and the second switching resistors or comparing each respective current with respect to a reference current in sequential manner or simultaneously for reading the data stored in the memory cell.

17. The method of operating the resistive random access memory as claimed in claim 16, wherein a high resistance state of the first or the second switching resistor represents data '1' and a low resistance state represents data '0'.

18. The method of operating the resistive random access memory as claimed in claim 17, each memory cell storing two-bit data correspondent to the first and second switching resistor respectively,
- during the read operation, the larger one between currents of the first and the second switching resistor represents data '0', while the other represents data '1'.

19. A method of operating the resistive random access memory as claimed in claim 12, comprising:
- a write operation comprising steps of:
  - applying a first voltage pulse to the first bit-line, and applying a second voltage pulse to the word-line to turn on the gFET, a high write current pulse triggering change of the resistance state and storing data into the first switching resistor, and repeating above procedure and storing the opposite resistance state into the second switching resistor; and
  - applying a first voltage pulse with pulse height to the first bit-line, the second bit-line being grounded, the drain being grounded; and
  - applying a second voltage pulse with pulse height to the gate of the gFET through the word-line to turn on the gFET, a writing current pulse triggering resistance change in the first switching resistors; and
- a read operation comprising steps of:
  - applying a third voltage pulse with pulse height to the first bit-line and the second bit-line, the drain being grounded;
  - applying a second voltage pulse with pulse height to the word-line to turn on the gFET to trigger the read currents in the first and the second switching resistors, wherein read current is large enough for sense amplifier to detect, and also small enough to avoid degradation of the resistance states in the switching resistor; and
  - comparing the first and the second read currents for reading data stored in the memory cell.

20. The method of operating the resistive random access memory as claimed in claim 19, wherein during the write operation,
- a high resistance state of the first switching resistor and a low resistance state of the second represents data '1', and
- a low resistance state of the first switching resistor and a high resistance state of the second represents data '0'.

21. The method of operating the resistive random access memory as claimed in claim 20, wherein during the read operation, a first state that the current through the first switching resistor is larger than the current through the second switching resistor represents data '0', and a second state that the current through the first switching resistor is smaller than the current through the second switching resistor represents data '1'.

22. The method of operating the resistive random access memory as claimed in claim 19, wherein the write operation of the first and the second switching resistor is performed in sequential manner.

* * * * *